United States Patent

Hanna

[15] 3,706,937

[45] Dec. 19, 1972

[54] GAIN CONTROLLED AMPLIFIER FOR INTEGRATED CIRCUIT APPLICATIONS

[72] Inventor: John E. Hanna, San Jose, Calif.

[73] Assignee: National Semiconductor Corporation, Santa Clara, Calif.

[22] Filed: Dec. 3, 1970

[21] Appl. No.: 94,683

[52] U.S. Cl. ......................330/28, 330/29, 330/30 D, 330/145

[51] Int. Cl. ...............................................H03g 3/30

[58] Field of Search...........330/28, 29, 30 D, 69, 145

[56] References Cited

UNITED STATES PATENTS

| | | | |
|---|---|---|---|
| 3,531,731 | 9/1970 | Matsuura et al. | 330/29 X |
| 2,610,260 | 9/1952 | Moffett | 330/69 |

FOREIGN PATENTS OR APPLICATIONS

| | | | |
|---|---|---|---|
| 1,286,123 | 1/1969 | Germany | 330/30 D |

*Primary Examiner*—Roy Lake
*Assistant Examiner*—James B. Mullins
*Attorney*—Lowhurst & Hamrick

[57] ABSTRACT

A gain controlled amplifier circuit in which the amplifying element, such as a transistor, has its emitter-collector circuit connected to a gain control circuit which supplies a constant operating current and changes its AC impedance in accordance with an AGC signal. The gain control circuit includes a first branch having an impedance which varies with the externally applied AGC signal and a second branch having an impedance which varies with the current flow therethrough and which is connected to ground through an AC bypass. These two branches are connected in parallel to a constant current source so that the impedance of the first branch controls the current flow in the second branch and thereby its impedance.

8 Claims, 4 Drawing Figures

PATENTED DEC 19 1972 3,706,937

INVENTOR
JOHN E. HANNA
BY Lowhurst & Hamrick
ATTORNEYS

GAIN CONTROLLED AMPLIFIER FOR INTEGRATED CIRCUIT APPLICATIONS

BACKGROUND OF THE INVENTION

1. Field of the Invention

The present invention relates generally to gain controlled amplifier circuits and more particularly to such an amplifier having gain control circuitry which operates in a manner whereby the operational parameters other than gain of the amplifying elements, per se, do not vary with or as the result of the gain control operation.

2. DESCRIPTION OF THE PRIOR ART

In high frequency amplifying circuits, such as are commonly found in RF and IF circuits, some type of gain control is usually found desirable. Typically, some sort of gain control is accomplished in the first stage of the amplifier in order to prevent the successive stages from being overloaded. One of the problems encountered in providing gain control in the first stage of an amplifier, and particularly in integrated circuit amplifier, is that of maintaining the DC voltages (quiescent voltage) applied to the succeeding stages at a constant value so as to maintain the frequency response of the various stages constant as gain control is effected.

The classic method of providing gain control to a transistorized amplifier is to vary the emitter-collector current through one of the input stages. This causes shifts in DC input levels to successive stages which either change their operating point or must be accommodated by appropriate design compromises.

Although there have been a number of techniques recently developed using signal cancellation methods, such techniques are difficult to use because of the symmetric gain control operational characteristics. One technique involves the use of constant emitter degeneration with variable loads and internal transconductance. This method, however, limits the output voltage swing capability and is subject to certain other problems. The difficulties encountered in using such prior art methods have thus made it desirable to seek improved techniques and apparatus for use in gain controlled amplifier circuitry.

OBJECTS OF THE PRESENT INVENTION

It is therefore a primary object of the present invention to provide a novel amplifying circuit having means for providing gain control without changing the operational characteristics of the amplifier stage being controlled.

Another object of the present invention is to provide a novel integrated circuit amplifier having gain control capability which is independent of the operational characteristics of the amplifying stage.

Still another object of the present invention is to provide a novel integrated circuit, gain controlled amplifier using a novel variable AC emitter impedance which varies the gain without changing the operating point of the amplifying stage.

SUMMARY OF THE INVENTION

In accordance with the present invention, a novel gain control circuit is disclosed which provides gain control for transistor amplifiers without affecting the operating characteristics of the amplifier. In a simplified embodiment, the circuit includes a variable impedance transistor branch controlled by a gain control signal and a diode-connected transistor branch. These two branches are connected together in parallel in the emitter circuit of the amplifying transistor which also includes a constant current source, and to ground through an AC bypass. Since the impedance of the diode-connected transistor branch varies with the emitter current flowing therethrough, and since the variable impedance transistor is controlled by the AGC signal, it follows that, since the total emitter current is constant, the current in the diode-connected transistor branch is a function of the impedance of the other branch and controls the AC impedance and therefore the gain of the amplifier circuit.

Also disclosed is an additional embodiment of the invention in the form of a differential amplifier suitable for integrated circuit applications.

The many advantages of the present invention will become apparent to those skilled in the art after having read the following detailed disclosure which makes reference to the several figures of the drawing.

IN THE DRAWING

DETAILED DESCRIPTION OF THE PREFERRED EMBODIMENTS

Figures 1, 2, 3, 4:
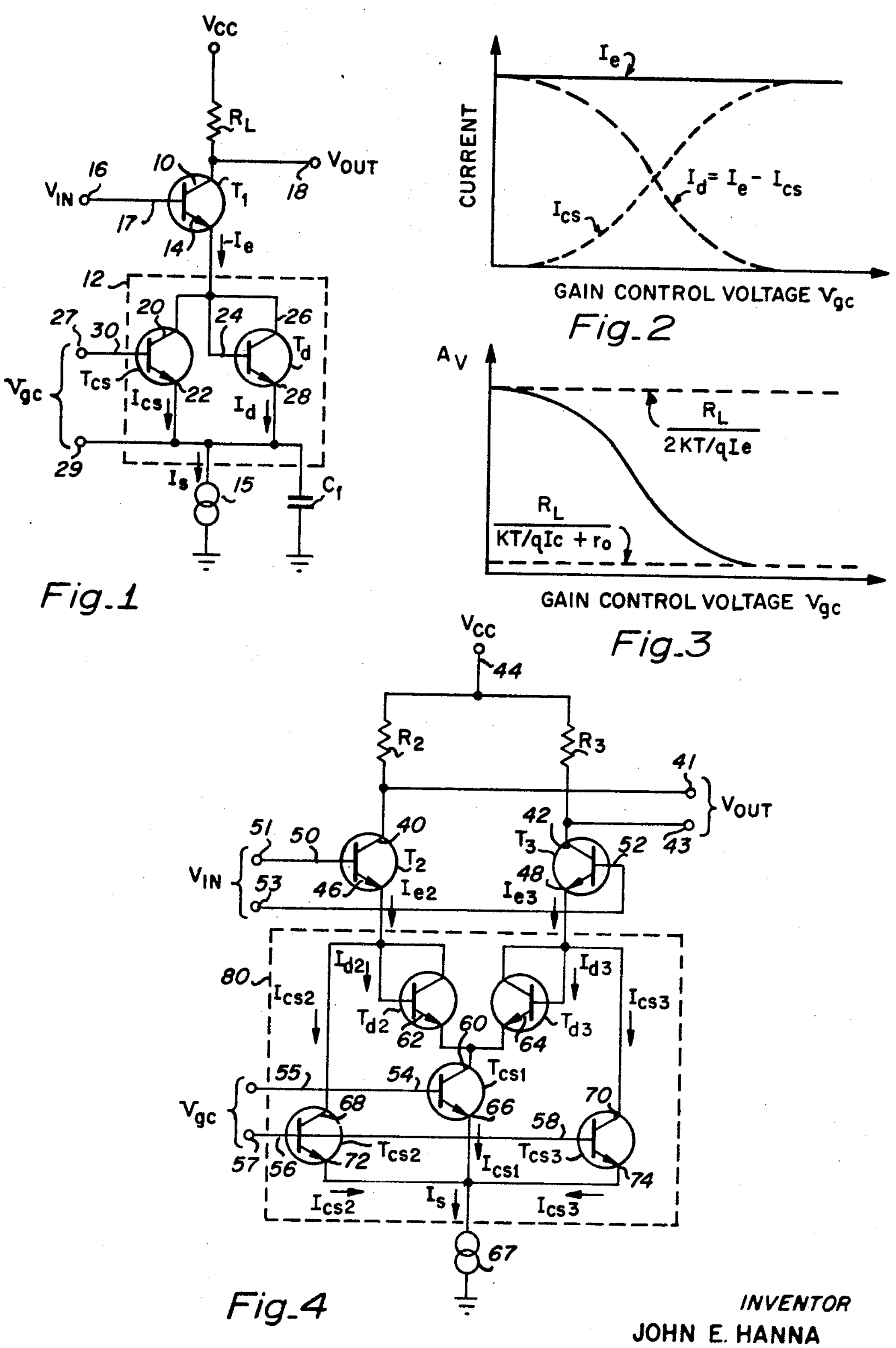
FIG. 1 is a schematic diagram of an amplifying stage having gain control features provided in accordance with the present invention.
FIG. 2 is a diagram illustrating current vs. gain control voltage at several points in the circuit illustrated in FIG. 1.
FIG. 3 is a diagram illustrating voltage gain vs. gain control voltage in the circuit illustrated in FIG. 1.
FIG. 4 is a schematic diagram illustrating a differential amplifier circuit having gain control features provided in accordance with the present invention.

Referring now to FIG. 1 of the drawing, there is shown in simplified form a one stage transistorized amplifier circuit in accordance with the present invention. The circuit includes an amplifying NPN transistor $T_1$ having a load resistor $R_L$ coupling its collection 10 to a source of potential $V_{cc}$, and a gain control circuit 12 coupling its emitter 14 to one side of a constant current source 15. The AC input signals $V_{in}$ to be amplified by the amplifier circuit are applied to an input terminal 16 coupled to the base 17 of transistor $T_1$ and the amplified AC output signal is taken at an output terminal 18 connected to collector 10.

Gain control circuit 12 includes an externally variable impedance branch having an NPN transistor $T_{cs}$ which has its collector 20 coupled to emitter 14 of transistor $T_1$ and its emitter 22 coupled to one side of current source 15. Also coupled between emitter 14 of transistor $T_1$ and current source 15, and in parallel with transistor $T_{cs}$, is an internally variable impedance branch including a non-linear p-n junction device, such as a diode (not shown) or diode-connected NPN transistor $T_d$ which has its base 24 and collector 26 coupled to each other and to emitter 14, and its emitter 28 coupled to current source 15. A capacitor $C_1$ is shunted across current source 15 to provide a reference to ground and a low impedance AC path to ground for AC signals. As will be explained hereinafter, when two stages of this amplifier circuit are combined to form a differential amplifier, a voltage reference is inherently available and no bypass capacitor is necessary.

The AC impedances of current source 15 and of the externally variable impedance branch are made high and of the internally variable impedance branch is made lower so that the AC signals will seek the lower impedance path to ground through the base-emitter junction of transistor $T_1$, the device $T_d$, and capacitor $C_1$.

Even though the impedance of transistor $T_{cs}$ is substantially higher than that of diode-connected transistor $T_d$, and the application of the AGC signal only changes the impedance of transistor $T_{cs}$ slightly, it will still be referred to as a first impedance means since it does change its impedance sufficiently to materially change the current shunted through transistor $T_d$ and thereby control the drain of the amplifier circuit.

The gain control voltage $V_{gc}$ is applied across terminals 27 and 29, i.e., across the base-emitter junction of transistor $T_{cs}$. Since the emitter current $I_e$ flowing through transistor $T_1$ is maintained constant because current source 15 is held constant, the current $I_d$ through transistor $T_d$ can be controlled by varying the current $I_{cs}$ through transistor $T_{cs}$ by applying the gain control voltage $V_{gc}$ to the base 30 thereof. And since current $I_d$ determines the effective internal diffusion resistance $r_e$ of transistor $T_d$ to AC signals, as explained in the aforementioned copending application, the AC gain of the amplifying stage can be controlled without changing the operating current $I_e$ through amplifying transistor $T_1$.

An analytical approach to the operation of the circuit illustrated in FIG. 1 indicates that an expression for the voltage gain $A_v$ of the circuit can be written as $$A_v \doteq R_L/(r_e+R_E) \quad (1)$$

where $r_e$ is the internal diffusion resistance of transistor $T_1$ and $R_E$ is the effective resistance of the gain control circuit 12. Since transistor $T_{cs}$ and $T_d$ are connected in parallel with each other, $R_E$ may be expressed as $$R_E=(r_o r_d)/(r_o+r_d) \quad (2)$$

where $r_o$ is the dynamic output resistance of transistor $T_{cs}$ and $r_d$ is the internal diffusion resistance of transistor $T_d$. As mentioned above, $r_o$ is much larger than $r_d$ and can be made essentially an open circuit to AC current. Thus, $r_o$ can be ignored and $r_d$ which can be expressed as $$r_d=(KT/q)/I_d \quad (3)$$

can be substituted for $R_E$ and equation (1) can be rewritten as $$(4) \quad A_v=\frac{R_L}{\frac{KT/q}{I_e}+\frac{KT/q}{I_d}}$$

where $K$ is Boltzmann's constant, $T$ is the temperature in degrees Kelvin, $q$ is the charge on an electron, $I_e$ is the emitter current of transistor $T_1$, and $I_d$ is the emitter current of transistor $T_d$.

And furthermore, since the current $I_e$ is equal to the sum of the currents $I_{cs}$ and $I_d$, $I_d$ can be expressed as $$I_d=pI_e \quad (5)$$

where $p$ is a percentage factor, and accordingly equation (4) can now be rewritten as $$(6) \quad A_v=\frac{R_L}{\frac{KT}{qI_e}\left(1+\frac{1}{p}\right)}$$

It will thus be seen that the gain control network 12, while not effecting the emitter current $I_e$ of the amplifying transistor $T_1$, does, in response to a gain control voltage $V_{gc}$, effectively change the AC impedance seen by the emitter 14, and consequently enables the desired gain control function to be accomplished without varying the DC operating current through transistor $T_1$.

Among the many advantages of such a circuit technique are that since the operating point of transistor $T_1$ is maintained constant, the DC output current level at output terminal 18 is maintained constant, the voltage across $T_1$ is maintained constant, and therefore the frequency response of the transistor can be held constant and be determined quite accurately. Such a circuit, because of $V_{be}$ and resistor matching with the circuitry generating the voltage $V_{gc}$ and the current source $I_s$, is also accurately reproducible in integrated circuit form.

The operation of the circuit illustrated in FIG. 1 is illustrated by the diagrams shown in FIG. 2 and 3. In FIG. 2 it will be noted that whereas the amplifier operating point current $I_e$ is held constant, an increase in the gain control voltage $V_{gc}$ causes a change in the current $I_{cs}$ through transistor $T_{cs}$ which varies nonlinearly in accordance with the operating characteristics of that transistor. And since the diode current $I_d$ through diode-connected transistor $T_d$ is equal to the difference between $I_e$ and $I_{cs}$, $I_d$ will decrease proportionally as $I_{cs}$ increases.

Referring now again to FIG. 1 of the drawing, it will be appreciated that whereas the proportion of current $I_e$ through $T_d$ is large and thus the value of $r_d$ is small for zero gain control voltage, the current $I_d$ will decrease and therefore $r_d$ will increase as the gain control voltage $V_{gc}$ is increased. Thus, it will be seen that in accordance with the present invention the amplifier gain $A_v$ can be varied between the limits $$A_v \max = R_L/(2KT/qI_e) \quad (7)$$

and $$A_v \min = R_L/(KT/qI_e + r_o). \quad (8)$$

Turning now to FIG. 4 of the drawing, a differential amplifier employing the novel gain control technique of the present invention is illustrated and comprises, in essence, two circuits similar to those illustrated in FIG. 1. In this embodiment, the two amplifying NPN transistors $T_2$ and $T_3$ have their collectors 40 and 42, respectively, coupled through the load resistors $R_2$ and $R_3$ to $V_{cc}$ at terminal 44. The emitters 46 and 48 are coupled together through a pair of diode connected NPN transistors $T_{d2}$ and $T_{d3}$, respectively. The input signal $v_{in}$ is applied across the bases 50 and 52 of transistors $T_2$ and $T_3$, respectively, and the resultant output signal $v_{out}$ is taken across the collectors 40 and 42.

The currents through diode connected NPN transistors $T_{d2}$ and $T_{d3}$ are controlled by an input voltage $V_{gc}$ which is applied across the base 54 and commonly connected bases 56 and 58 of the externally variable impedance NPN transistors $T_{cs1}$, $T_{cs2}$ and $T_{cs3}$, respectively. The collector 60 of $T_{cs1}$ is coupled to the emitters 62 and 64 of transistors $T_{d2}$ and $T_{d3}$, respectively, and the emitter 66 is coupled to one side of the current source 67. The collector 68 of transistor $T_{cs2}$ is connected to emitter 46 of transistor $T_2$ and the collector 70 of transistor $T_{cs3}$ is connected to emitter 48 of transistor $T_3$. The emitters 72 and 74 of transistors $T_{cs2}$ and $T_{cs3}$, respectively, are coupled to the top side of current source 67 along with emitter 66.

In practice, the geometrics of transistors $T_{cs2}$ and $T_{cs3}$ are made equal so that their emitter currents $I_{cs2}$ and $I_{cs3}$ are equal. The geometry of transistor $T_{cs1}$ is typically chosen so that the emitter current $I_{cs1}$ is equal to the sum of the emitter currents $I_{cs2}$ and $I_{cs3}$ of transistors $T_{cs2}$ and $T_{cs3}$, i.e., $$I_{cs1}=2I_{cs2} \quad (9)$$

The operation of the gain control circuitry 80, which includes transistors $T_{d2}$, $T_{d3}$, $T_{cs1}$, $T_{cs2}$ and $T_{cs3}$, of the differential amplifier embodiment illustrated in FIG. 4 is similar to that of the simplified embodiment illustrated in FIG. 1 in that by controlling the voltage $V_{gc}$ applied to the bases 54, 56 and 58 of transistors $T_{cs1}$, $T_{cs2}$ and $T_{cs3}$ the current through the diode-connected transistors $T_{d2}$ and $T_{d3}$ can be controlled thereby controlling the impedance seen by the emitters 46 and 48 of the gain of transistors $T_2$ and $T_3$. But whereas an AC low impedance bypass had to be supplied to the single stage embodiment of FIG. 1 in the form of capacitor $C_1$, the differential amplifier circuit embodiment of FIG. 4 includes an AC current path. This will become clearer by considering the AC voltage drops in the two circuits. In the circuit of FIG. 1, the AC voltage, at least to a rough approximation, has a drop across the base-emitter junction of transistor $T_1$ and across diode $T_d$. As the voltage drop changes, the amplification changes and unless capacitor $C_1$ were supplied, there would only be a voltage drop across high impedance source 15 and substantially no amplification. In the circuit of FIG. 4, the AC voltage drop of one input voltage with respect to the other is, at least to a rough approximation, across the base-emitter junction of transistor $T_2$, across device $T_{d2}$, across device $T_{d3}$, and across the emitter-base junction of transistor $T_3$. The voltage drops across the amplifying transistors are approximately the same, providing the same gain and the voltage drops across the diode-connected transistor are approximately the same and control the voltage drops across the amplifying transistors and therefore their gain.

As in the previous embodiment, the operation of the circuit of FIG. 4 can also be expressed analytically by noting that with no input signal $V_{in}$ applied to input terminals 51–53

$$I_{e2}=I_{e3} \quad (10)$$

and accordingly $$I_{e2}=I_{d2}+I_{cs2} \quad (11)$$

Consequently, the voltage gain $A_v$ for the circuit can be written as $$(12) \quad A_v=-\frac{R_L}{\frac{KT/q}{I_{e2}}+\frac{r_{o2}r_{d2}}{r_{o2}+r_{d2}}}$$

where $r_{o2}$ is the dynamic output resistance of transistor $T_{cs2}$ and $r_{d2}$ is the internal diffusion resistance of transistor $T_{d2}$. And as above, since $r_{o2}$ is much greater than $r_{d2}$, $I_{d2}$ can be written as $$I_{d2}=pI_S \quad (13)$$

where $p$ is greater than 0, but less than one-half. Thus, equation (12) can be rewritten as $$(14) \quad A_v=-\frac{R_L}{\frac{KT/q}{(1/2)I_S}+\frac{KT/q}{pI_S}}$$

or $$(15) \quad A_v=-\frac{R_L}{\frac{KT/q}{I_S}\left(2+\frac{1}{p}\right)}$$

Thus, when no gain control voltage $V_{gc}$ is applied across terminals 55–57, $p$ will approach one-half and $$A_{v\,max} \Rightarrow -[R_L/(4KT/qI_S)]. \quad (16)$$

However, as gain control is introduced by increasing $V_{gc}$, $p$ will approach zero making the denominator of equation (15) large so that $$I_{e2} \Rightarrow I_{d2}+I_{cs2} \Rightarrow ½\, I_s \quad (17)$$

and thus $$A_{v\,min}=-[R_L/(2KT/qI_s+r_{o2})] \quad (18)$$

Therefore, since there is no change in the emitter operating points of either $T_2$ or $T_3$, the small signal bandwidth of the amplifier remains constant independently of gain control and the DC level at output terminals 41–43 also remains constant.

It is contemplated that certain modifications of the present invention will become apparent to those of skill in the art after having read the above disclosure. For example, one might choose to modify the circuits to enable the use of PNP transistors instead of the disclosed NPN transistors. An similarly, one might modify the circuit of FIG. 4 for single ended output utilization. Moreover, certain applications may permit the substitution of field effect transistors for certain ones of the various circuit elements disclosed above. It is therefore, to be understood that the above described circuits are by way of illustration only and are in no way intended to be limiting. Accordingly, I intend that the appended claims be interpreted as covering all modifications which fall within the true spirit and scope of the invention.

What is claimed is:

1. A gain controlled amplifier comprising:
an amplifier transistor;
a current source for supplying operating current to said amplifier transistor; and
gain control circuit means coupling said amplifier transistor to said current source to couple said operating current into said amplifier transistor, said gain control circuit means including
a first transistor having an emitter-collector circuit coupled between said amplifier transistor and said current source and a base to which a gain control signal is applied to vary the impedance of said first transistor, and
a diode coupled in parallel with the emitter-collector circuit of said first transistor between said amplifier transistor and said current source, said operating current being directed through said diode as the impedance of said first transistor is changed to thereby change the impedance of said diode and the gain of said amplifier transistor.

2. A gain controlled amplifier as recited in claim 1 which further includes means for providing a low impedance AC current path by-passing said current source.

3. A gain controlled amplifier as recited in claim 1 wherein said amplifier transistor includes a first electrode for receiving an input signal, a second electrode coupled to said gain control circuit means and a third electrode from which an output signal can be obtained.

4. A gain controlled amplifier as recited in claim 1 wherein said amplifier transistor includes a base, an emitter and a collector, and said diode comprises a transistor having a collector, emitter, and base, the emitter of said amplifier transistor being coupled to the base and collector of said diode transistor, and the diode transistor emitter being coupled to said current source means.

5. A gain controlled amplifier as recited in claim 4 wherein the collector of said first transistor is coupled to the emitter of said amplifier transistor and the emitter of said first transistor is coupled to the emitter of said diode transistor.

6. A gain controlled differential amplifier comprising
a first amplifier transistor and a second amplifier transistor in parallel with said first amplifier transistor,
a current source for supplying operating current to said two parallel coupled amplifier transistors,
and a pair of gain control circuit means, one for each of said amplifier transistors and coupling said associated amplifier transistor to said current source to couple operating current into the associated amplifier transistor, each of said gain control circuit means including
a first transistor having an emitter-collector circuit coupled between said associated amplifier transistor and said current source and a base to which a gain control signal is applied to vary the impedance of said first transistor, and
a diode coupled in parallel with the emitter-collector circuit of said first transistor between said associated amplifier transistor and said current source, said operating current being directed through said diode as the impedance of said associated first transistor is changed to thereby change the impedance of said diode and the gain of said amplifier transistors.

7. A gain controlled differential amplifier as claimed in claim 6 including an additional transistor with its emitter-collector circuit coupled between the two diodes and the current source and having a base to which said gain control signal is coupled.

8. A gain controlled differential amplifier as recited in claim 6 wherein said amplifier transistors each include a base, an emitter and a collector, and said diodes each comprise a transistor having a collector, emitter, and base, the emitters of said two amplifier transistors being coupled to the base and collector of the associated diode transistor, and the diode transistor emitters being coupled to said current source means.

* * * * *